United States Patent [19]
Shoji

[11] Patent Number: 5,959,480
[45] Date of Patent: Sep. 28, 1999

[54] DIGITAL SIGNAL TRANSITION EDGE ALIGNMENT USING INTERACTING INVERTER CHAINS

[75] Inventor: Masakazu Shoji, Warren, N.J.

[73] Assignee: Lucent Technologies Inc., Murray Hill, N.J.

[21] Appl. No.: 08/811,981

[22] Filed: Mar. 5, 1997

[51] Int. Cl.[6] ....................................................... H03L 7/00
[52] U.S. Cl. .......................... 327/161; 327/233; 327/252; 327/283; 327/290
[58] Field of Search .................................. 327/141, 161, 327/231, 233–235, 237, 252, 253, 261, 262, 268, 270, 271, 276, 277, 283, 290, 293, 295, 297

[56] References Cited

U.S. PATENT DOCUMENTS

| | | | |
|---|---|---|---|
| 4,890,022 | 12/1989 | Endo | 327/261 |
| 5,355,037 | 10/1994 | Andresen et al. | 327/277 |
| 5,644,261 | 7/1997 | Frisch et al. | 327/277 |

*Primary Examiner*—Kenneth B. Wells

[57] ABSTRACT

Apparatus and method for aligning signal transition edges in high-speed complementary metal-oxide-semiconductor (CMOS) integrated circuits and other electronic circuits, systems and devices. A transition edge alignment circuit in accordance with the invention includes first and second inverter chains, each having a plurality of series-connected inverters. A first signal, which may be a digital logic signal, is applied to an input of the first inverter chain. A second signal, which may be a clock signal used to latch the logic signal in an integrated circuit, is applied to an input of the second inverter chain. The inverter chains may be constructed such that the inverters of the second chain have a stronger drive capability than the corresponding inverters of the first chain. Capacitive coupling is provided between outputs of inverters of the first chain and outputs of corresponding inverters of the second chain. The capacitive coupling provides interaction between the first and second inverter chains which acts to align transition edges of the first and second signals as the signals propagate through the respective first and second inverter chains. The edge alignment process may be facilitated by intentionally reducing a transition rate of either the first or second signal. This intentional transition rate reduction could be provided by applying the first or second signal to a delay circuit at an input of the corresponding inverter chain, or by connecting additional capacitive loads to outputs of the first several inverters in the corresponding inverter chain.

33 Claims, 9 Drawing Sheets

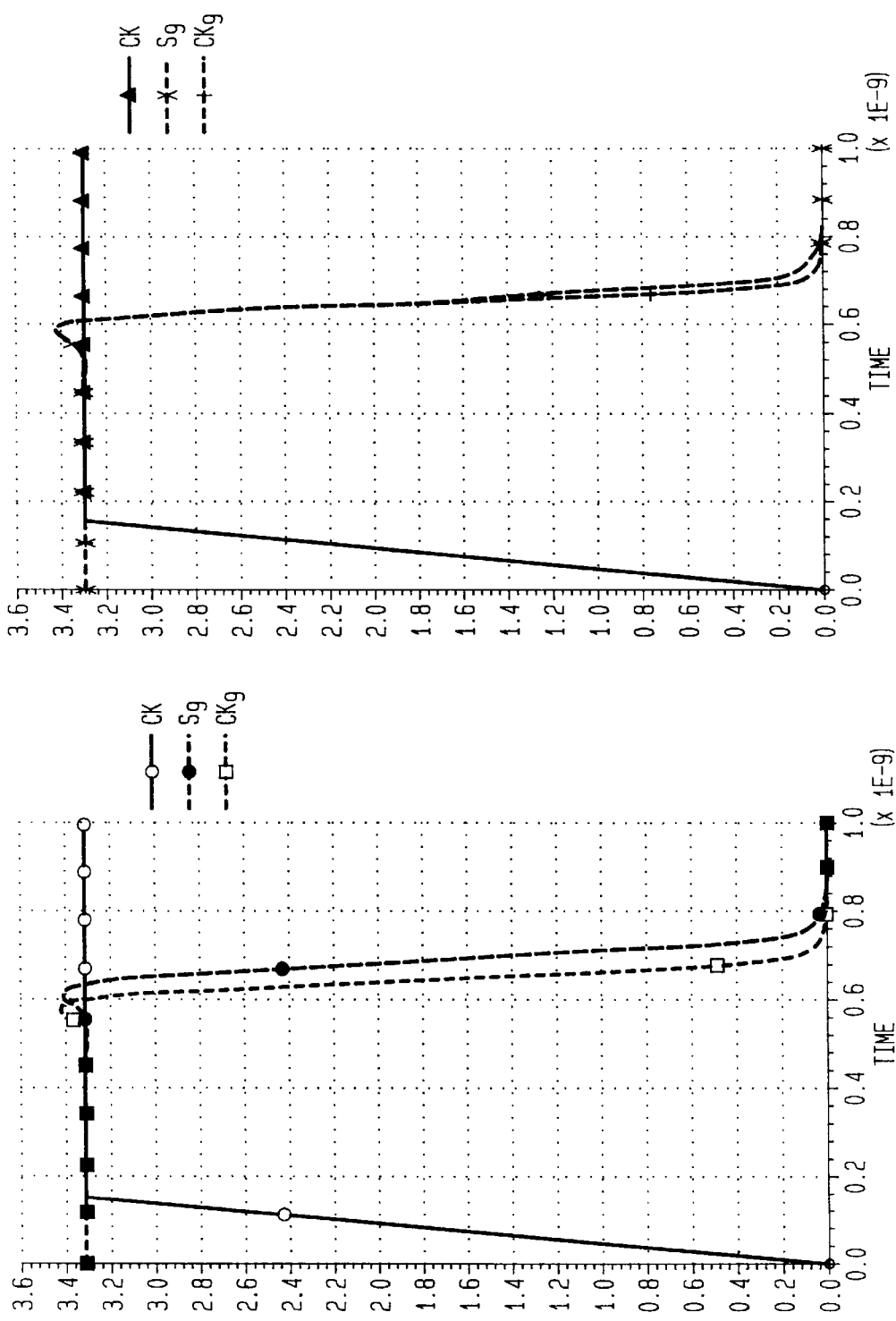

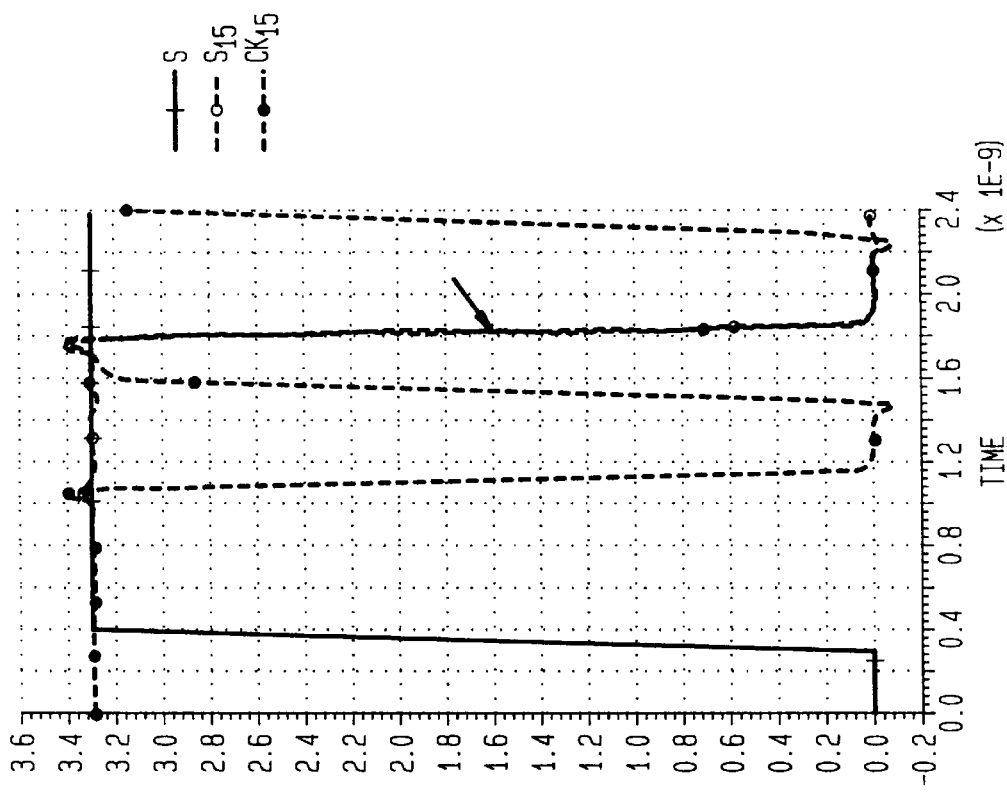
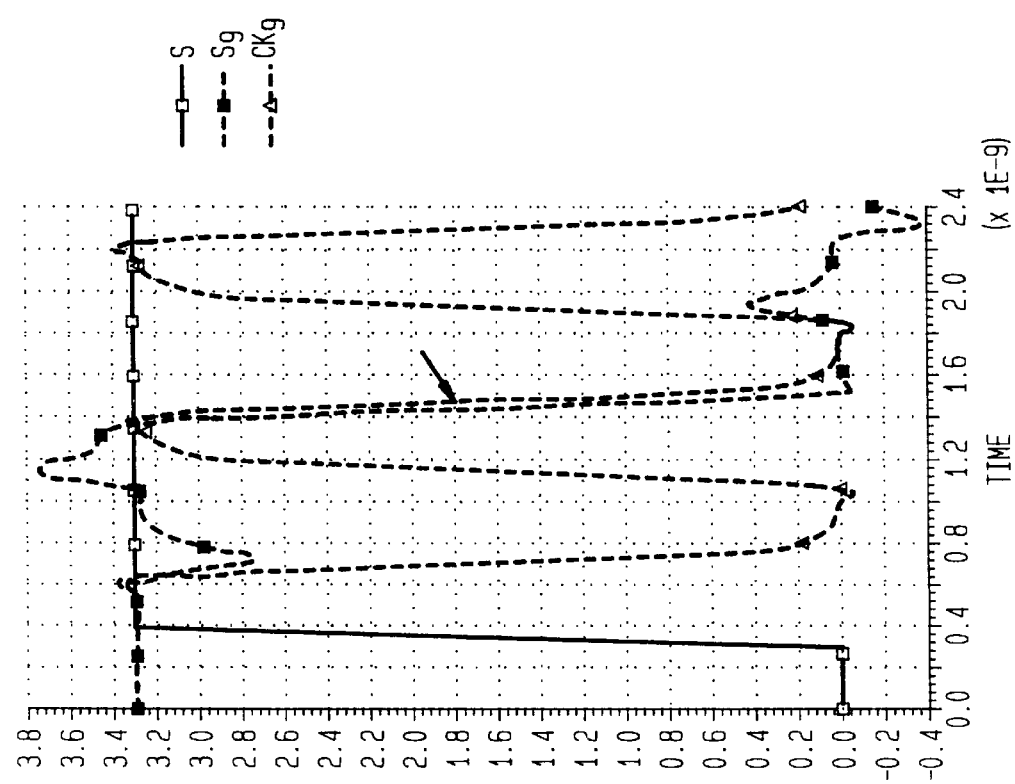
FIG. 10B
FIG. 10A

DIGITAL SIGNAL TRANSITION EDGE ALIGNMENT USING INTERACTING INVERTER CHAINS

FIELD OF THE INVENTION

The present invention relates generally to signal transition edge alignment techniques and more particularly to interacting inverter chains suitable for aligning transition edges of digital signals in a complementary metal-oxide-semiconductor (CMOS) integrated circuit or other type of electronic circuit, system or device.

BACKGROUND OF THE INVENTION

Proper operation of high-speed CMOS integrated circuits generally requires accurate transition edge alignment between certain internal digital signals. For example, a typical CMOS divider circuit may receive as inputs a high-speed clock signal and a relatively lower speed logic signal such as a return-to-one or return-to-zero set/reset signal. The timing relationship between the clock signal transition edge and the logic signal transition edge must be maintained properly in order to ensure reliable operation of the divider circuit to which these signals may be applied. In many applications, the high-speed clock signal and the logic signal may be applied to a latch in which the clock signal transition edge is used to latch a particular logic state of the logic signal. Failure to provide the proper transition edge alignment at the input of the latch can lead to metastability within the latch or subsequent circuitry.

A conventional technique for providing edge alignment between such digital signals involves the use of double sampling. However, edge alignment circuits based on double sampling are unduly complex and therefore decrease the reliability and increase the cost and chip area of the corresponding integrated circuit. Furthermore, edge alignment circuits based on double sampling are generally susceptible to metastability as well.

It is therefore apparent that a need exists for an improved transition edge alignment technique which is simple to implement, resistant to metastability and suitable for use in many practical high-speed integrated circuit applications.

SUMMARY OF THE INVENTION

The present invention utilizes interacting inverter chains to align digital signal transition edges in a CMOS integrated circuit or other electronic circuit, system or device. First and second signals to be aligned are applied to inputs of respective first and second inverter chains. The first and second inverter chains include respective first and second pluralities of series-connected inverters. The first signal applied to the first chain may be a digital logic signal, such as a set/reset signal, which triggers a particular operation in a subsequent circuit. The second signal may be a high-speed digital clock signal which is used to latch a logic level of the logic signal in the subsequent circuit. Capacitive coupling is provided between outputs of at least a subset of the first plurality of series-connected inverters and corresponding outputs of at least a subset of the second plurality of series-connected inverters. The capacitive coupling provides nonlinear interaction between the first and second inverter chains which acts to align transition edges of the first and second signals as the signals propagate through the respective first and second inverter chains.

In accordance with another aspect of the invention, the inverters of one of the inverter chains may be provided with a stronger drive capability than the corresponding inverters of the other inverter chain. For example, in an embodiment in which a high-speed clock signal is applied to the first inverter chain and a logic signal to be aligned with a clock signal transition edge is applied to the second inverter chain, the inverters of the first inverter chain may have an effective channel width approximately k times larger than that of the corresponding inverters of the second inverter chain. The larger effective channel width may be provided by increasing the width of the channels in the corresponding inverter transistors, by decreasing the thickness of the gate insulator oxide, or by constructing a particular inverter as a parallel combination of several smaller inverters.

In accordance with another aspect of the invention, the edge alignment process may be facilitated by intentionally reducing a transition rate of one of the signals. By reducing the transition rate of one of the signals, the range of nonlinear interaction between the two interacting inverter chains is increased, and the alignment process can be carried out using inverter chains with fewer inverter stages. The intentional transition rate reduction could be provided for a particular signal by connecting a capacitive loading circuit to one or more nodes of the corresponding inverter chain. Such a loading circuit may be in the form of a simple RC circuit connected to an input of the inverter chain, or a number of additional capacitive loads connected to outputs of the first several inverters of the inverter chain. These additional capacitive loads may be implemented as additional inverters.

The edge alignment techniques of the present invention are particularly well-suited for use in high-speed CMOS circuit applications. For example, an edge alignment circuit in accordance with the invention can be used to align a logic signal transition edge with a transition edge of a 1.25 GHz clock signal over a fall range of possible clock signal phases at the circuit input. The present invention provides edge alignment in a manner which avoids the circuit complexity, metastability and other problems associated with conventional approaches such as double sampling. These and other advantages and features of the present invention will become more apparent from the accompanying drawings and the following detailed description.

BRIEF DESCRIPTION OF THE DRAWINGS

FIGS. 5A and 5B illustrate the operation of the FIG. 1 circuit under a simulation condition in which the same signal is applied to both circuit inputs.

FIGS. 6A and 6B, 7A and 7B, 8A and 8B, 9A and 9B and 10A and 10B show simulation results of an exemplary implementation of the FIG. 1 transition edge alignment circuit for initial relative delay values of 0.7 ns, 0.6 ns, 0.5 ns, 0.4 ns and 0.3 ns, respectively.

DETAILED DESCRIPTION OF THE INVENTION

The present invention will be illustrated below in conjunction with an exemplary transition edge alignment circuit particularly well-suited for implementation in a CMOS integrated circuit. It should be understood, however, that the invention is not limited to use with any particular type of circuit, but is instead more generally applicable to any electronic circuit, system or device in which it is desirable to align transition edges or otherwise provide a predetermined timing relationship between transition edges. Although the illustrative embodiments described herein involve aligning a transition edge of a return-to-one signal with a corresponding transition edge of a clock signal, the invention may be used with digital logic signals of any type. It will also be apparent that although these embodiments include two inverter chains, additional inverter chains may be provided for aligning additional signals. Furthermore, the inverters of the present invention are illustrative only. The term "inverter" as used herein is intended to include not only conventional CMOS inverters but also other types of inverting or non-inverting gates or circuits. The terms "coupling capacitor" or "capacitive coupling" are intended to include not only discrete circuit elements but also parasitic capacitances resulting from the particular circuit structure or layout used in a given application. The terms "align" or "alignment" in conjunction with signal transition edges are intended to include not only complete synchronization of the edges but also the provision of a predetermined timing relationship or known relative delay between the edges.

Figure 1:
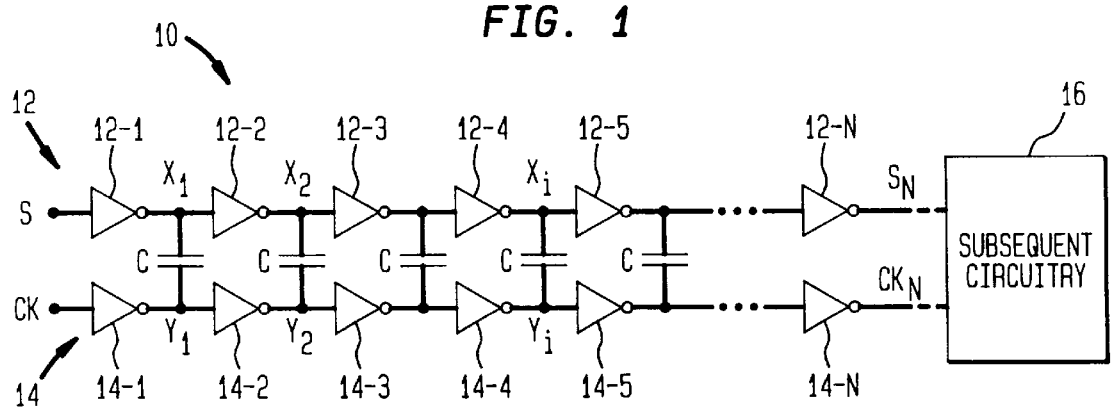
FIG. 1 is a schematic diagram of an exemplary transition edge alignment circuit in accordance with the present invention.

FIG. 1 shows an exemplary transition edge alignment circuit 10 in accordance with the present invention. The edge alignment circuit 10 includes a first inverter chain 12 and a second inverter chain 14. The first inverter chain 12 includes a number N of series-connected inverters 12-i, i=1, 2, ... N, while the second inverter chain 14 includes N series-connected inverters 14-i. Although each of the inverter chains 12 and 14 includes the same number of inverters in the FIG. 1 embodiment, alternative embodiments may utilize inverter chains with different numbers of inverters. In such alternative embodiments, the chains should generally be configured to provide matching signal transition polarities. The first inverter chain 12 has an input for receiving a first digital signal S. The signal S in this exemplary embodiment will be assumed to be a return-to-one digital signal used to trigger a particular operation in subsequent circuitry 16 connected to receive output signals from the transition edge alignment circuit 10. For example, S may be a set/reset signal used to trigger a set or reset operation in a high-speed CMOS divider circuit. The second inverter chain 14 has an input for receiving a second digital signal CK. The signal CK in this embodiment is assumed to be a clock signal which may be generated by a conditioned microwave oscillator or other suitable high-speed clock signal source. For example, the signal CK may be a clock signal having a clock period of about 0.8 nanoseconds and a frequency of 1.25 GHz. In many practical circuit applications, such as digital signal repeater systems, the phase relationship between transition edges of the S and CK signals is unknown. This will be the case if, for example, the signal S is a buffered version of a set/reset logic signal generated by a user flipping a switch. It is therefore desirable to align the transition edges of the S and CK signals in order to ensure reliable operation of the subsequent circuitry 16. The signals at the outputs of the N-stage inverter chains 12 and 14 will be referred to as $S_N$ and $CK_N$, respectively. The transition edge alignment circuit 10 and the subsequent circuitry 16 may correspond to different elements of a single integrated circuit.

In accordance with the invention, the first and second inverter chains 12, 14 are coupled together via a number of coupling capacitors C. For simplicity of description, each of the coupling capacitors C in the embodiment of FIG. 1 will be assumed to have the same capacitance value, although other embodiments may utilize a different capacitance value for each of the coupling capacitors C. Moreover, although a coupling capacitor C is shown between the outputs of the first N-1 pairs of corresponding inverters 12-i and 14-i in the respective chains 12 and 14, other embodiments may utilize coupling capacitors between all N pairs of inverter outputs or fewer than N-1 pairs of inverter outputs. As will be described in greater detail below, the capacitive coupling between the first and second inverter chains 12, 14 allows the chains to interact in a manner which aligns the transition edges of the inverter chain output signals $S_N$ and $CK_N$.

Figure 2:
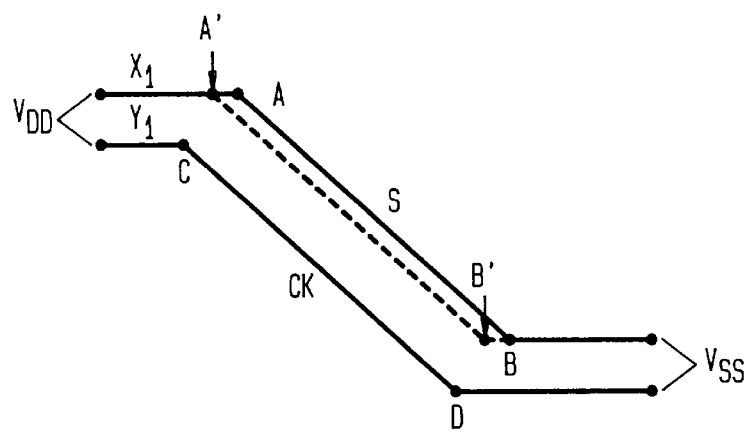
FIG. 2 illustrates the operation of the interacting inverter chains of the FIG. 1 circuit in aligning transition edges of first and second signals.

FIG. 2 illustrates the operation of the interacting inverter chains 12, 14 of the FIG. 1 circuit in aligning transition edges of the first and second digital signals S and CK. In this illustration, the second inverter chain 14 is assumed to be constructed of field effect transistors which are larger than those used to construct the first inverter chain 12. For example, the field effect transistors of the second chain 14 may be a constant k larger in effective channel width than those of the first inverter chain 12, where k>1. The second inverter chain 14 thus has a stronger drive capability than the first inverter chain 12. The larger effective channel width may be provided by increasing the width of the channels in the corresponding inverter transistors, by decreasing the thickness of the gate insulator oxide, by constructing a particular inverter as a parallel combination of several smaller inverters, or by other suitable techniques. The solid signal lines AB and CD in FIG. 2 represent logic HIGH to logic LOW transition edges of the signals S and CK, respectively, at output nodes $X_1$ and $Y_1$ of the inverters 12-1 and 14-1 in an embodiment in which the first coupling capacitor C has a value of zero. The transition edges AB and CD correspond to logic LOW to logic HIGH signal transitions at the inputs of respective inverters 12-1 and 14-1. The $V_{DD}$ and $V_{SS}$ references for the signals at nodes $X_1$ and $Y_1$ have been shifted for clarity of illustration. It can be seen that the transition edge AB of the signal S at node $X_1$ is delayed in time relative to the corresponding transition edge CD of the signal CK at node $Y_1$.

If the coupling capacitor C between the outputs of inverters 12-1 and 14-1 is provided with a non-zero value, the stronger inverter 14-1 acts to alter the node $X_1$ waveform generated by the weaker inverter 12-1. As a result, the HIGH to LOW transition AB of signal S is shifted slightly earlier in time relative to its position in the case of zero capacitive coupling. The shifted transition edge of signal S is shown by dashed line A'B' in FIG. 2. The interaction between inverters 12-1 and 14-1 of the first and second inverter chains 12, 14 thus pulls the transition edge of signal S toward the transition edge of the clock signal CK. Although illustrated for a HIGH to LOW transition, a similar effect is produced for LOW to HIGH transitions. The two signals S and CK interact in this manner while propagating through the two separate inverter chains 12 and 14 such that the S and CK transition edges are pulled together. If a sufficient number of inverter stages are provided in each of the inverter chains, the transition edges of output signals $S_N$ and $CK_N$ will be fully aligned and the signals will be synchronized.

In the exemplary circuit of FIG. 1, in which it is assumed that the inverters of inverter chain 14 are substantially stronger than the inverters of inverter chain 12, the signal propagation velocity through chain 14 is not influenced significantly by the interaction, but the signal velocity through chain 12 is effectively increased, and the signal transition edges are aligned by the velocity difference. After the transition edges of the input signals S and CK are aligned, the output signal $CK_N$ may be used to drive a latch in subsequent circuitry 16 to capture a logic level of the signal $S_N$. Given that the relative transition edge location of signals $S_N$ and $CK_N$ is known with certainty, the latch will not be susceptible to metastability. The interaction between inverter chains 12 and 14 in the edge alignment circuit of FIG. 1 is generally nonlinear. The transition edge alignment of the present invention may thus be viewed as synchronization of two phenomena by nonlinear interaction. Similar types of nonlinear interaction occur in applications such as the synchronization of a free-running oscillator by an injected signal.

Figure 3:
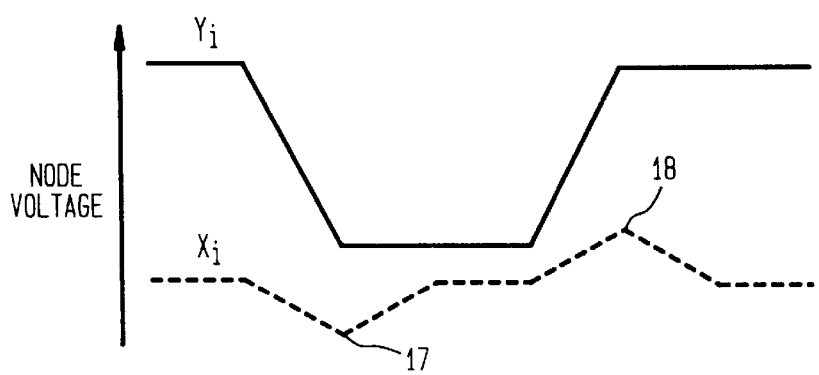
FIG. 3 shows the effect of variation in node voltage in one of the inverter chains of the FIG. 1 circuit on the node voltage of the other inverter chain.

FIG. 3 illustrates the voltage variation produced at a node $X_i$ at the output of inverter 12-i as a result of signal transitions at a node $Y_i$ at the output of inverter 14-i, during a time period for which input signal S is at a constant voltage level. In the absence of a transition edge in signal S, the capacitive coupling between inverter chain 12 and inverter chain 14 produces a dip 17 in node $X_i$ voltage for a HIGH to LOW transition at node $Y_i$, and a peak 18 for a LOW to HIGH transition at node $Y_i$. The amount of capacitive coupling between inverter chains 12 and 14 is selected such that the dip 17 and peak 18 do not create a switching event or other noise problem in the inverter chain 12. The maximum induced voltages at nodes $X_i$ in chain 12 should thus be less than the switching threshold voltage of the inverters 12-i in that chain, which is generally about one-half of the power supply voltage in CMOS applications.

Figure 4B:
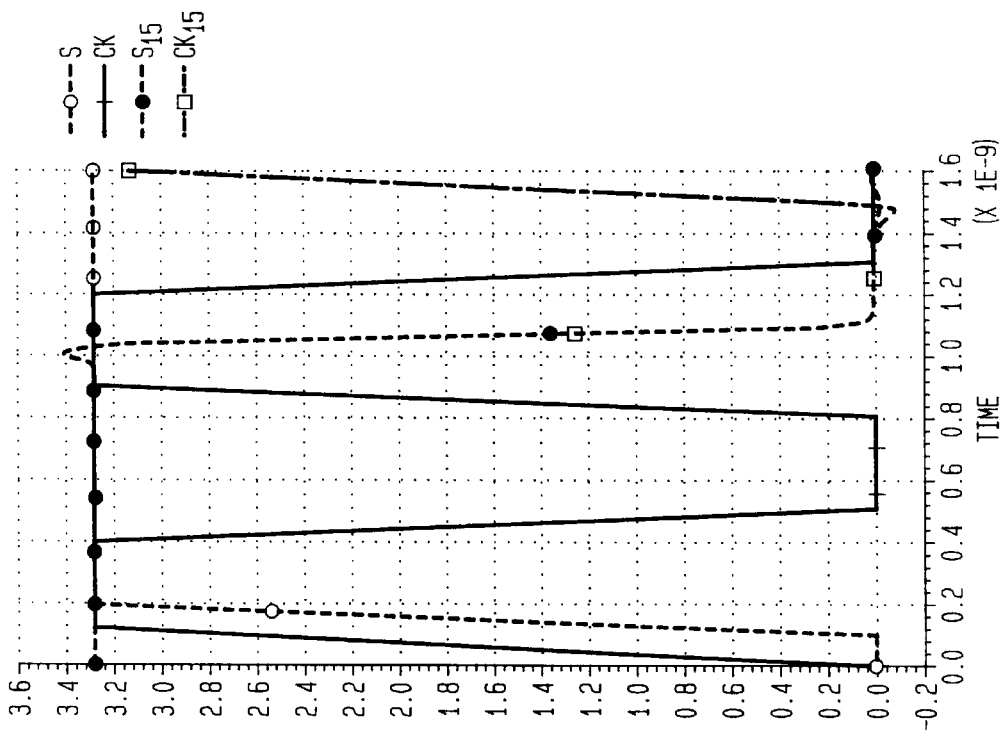
FIGS. 4A and 4B show simulation results of an exemplary implementation of the FIG. 1 transition edge alignment circuit.
Figure 4A:
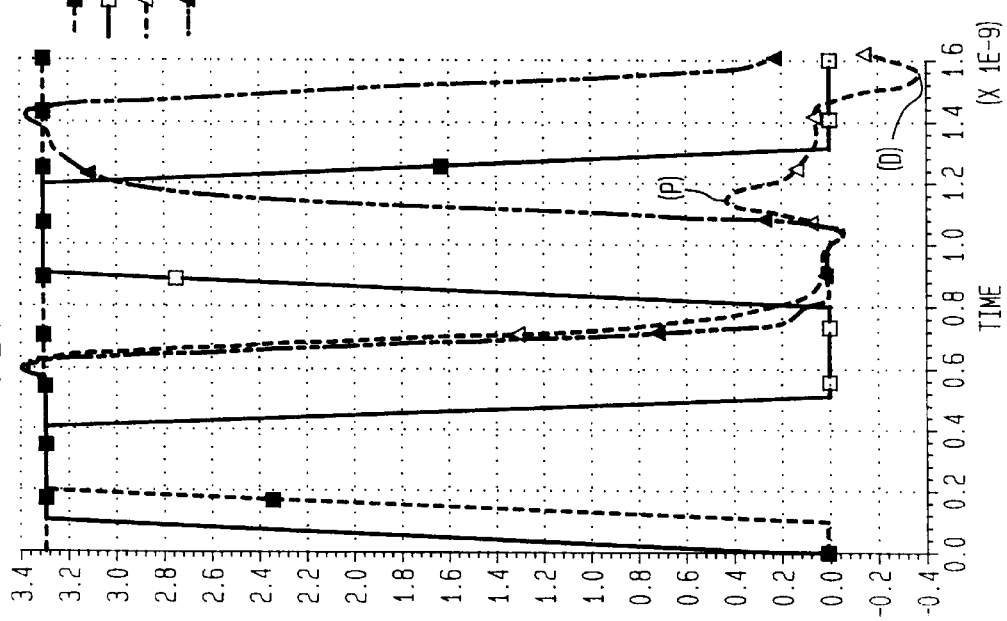
Figure 6B:
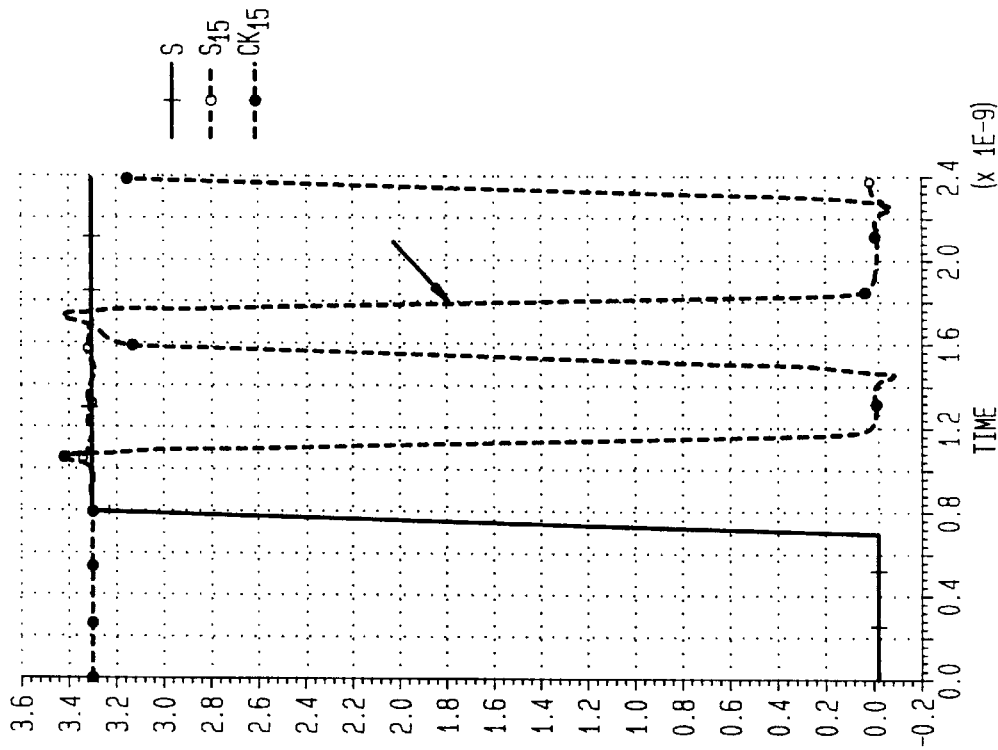
Figure 6A:
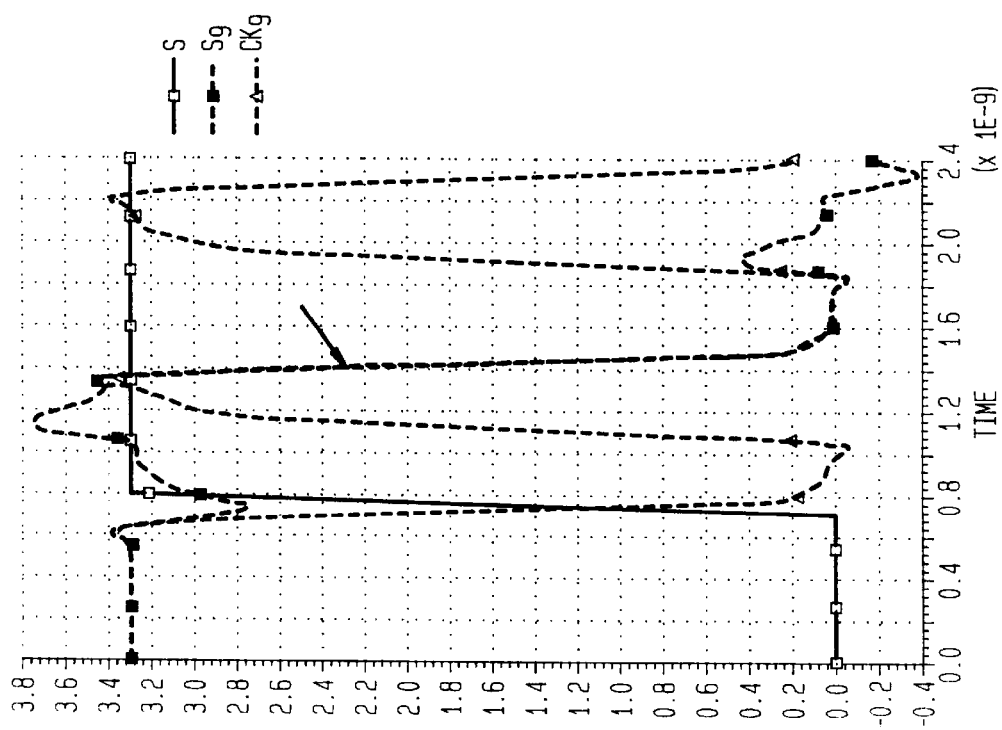
Figure 7A:
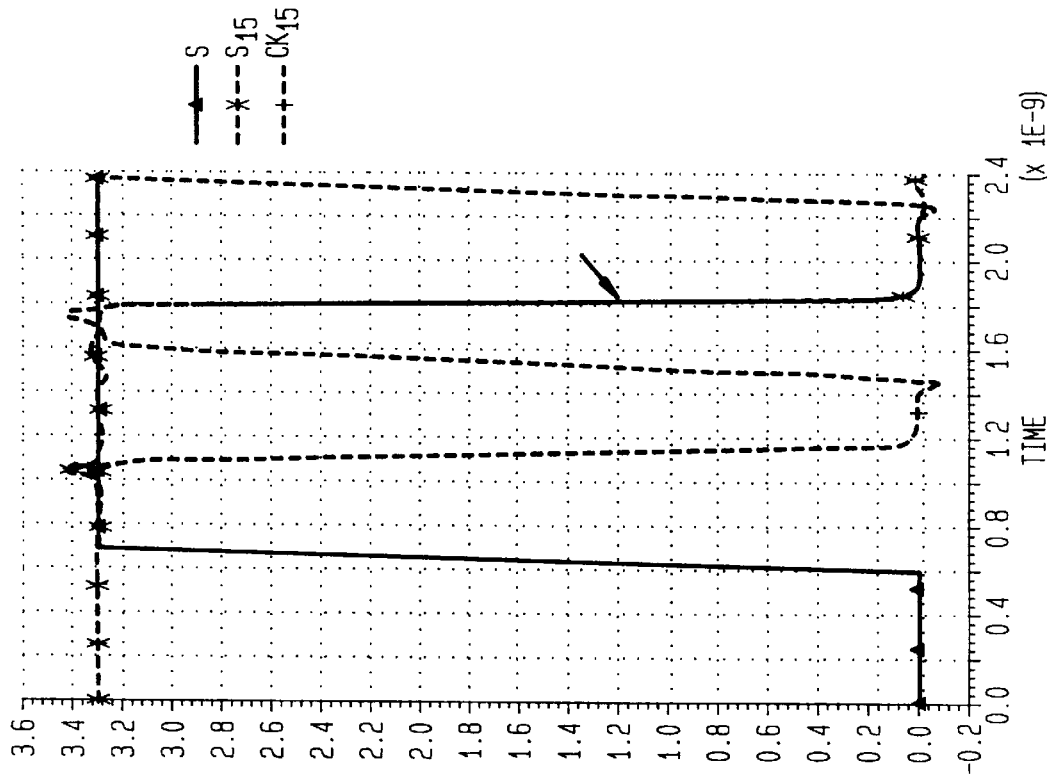
Figure 7B:
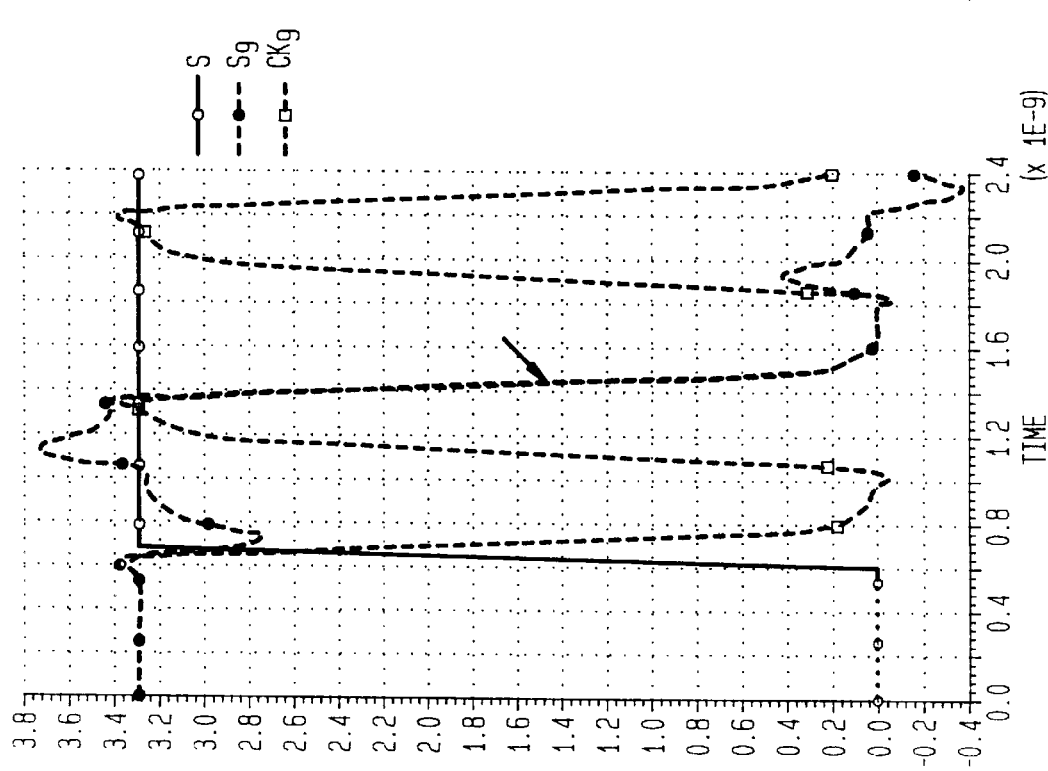
Figure 8B:
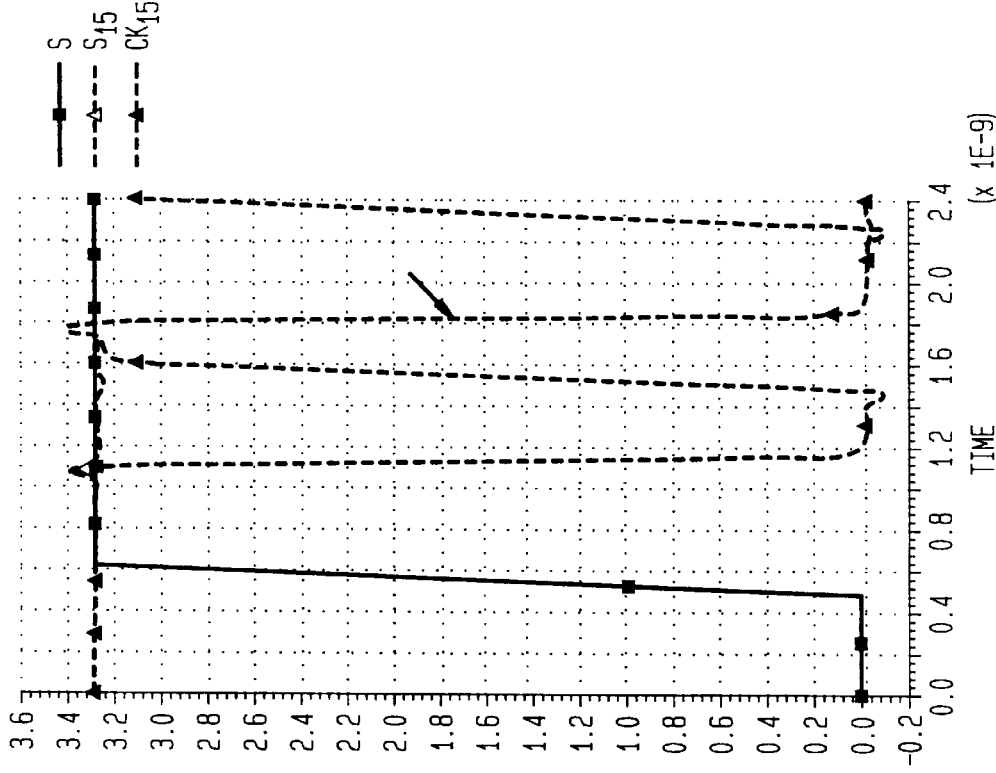
Figure 8A:
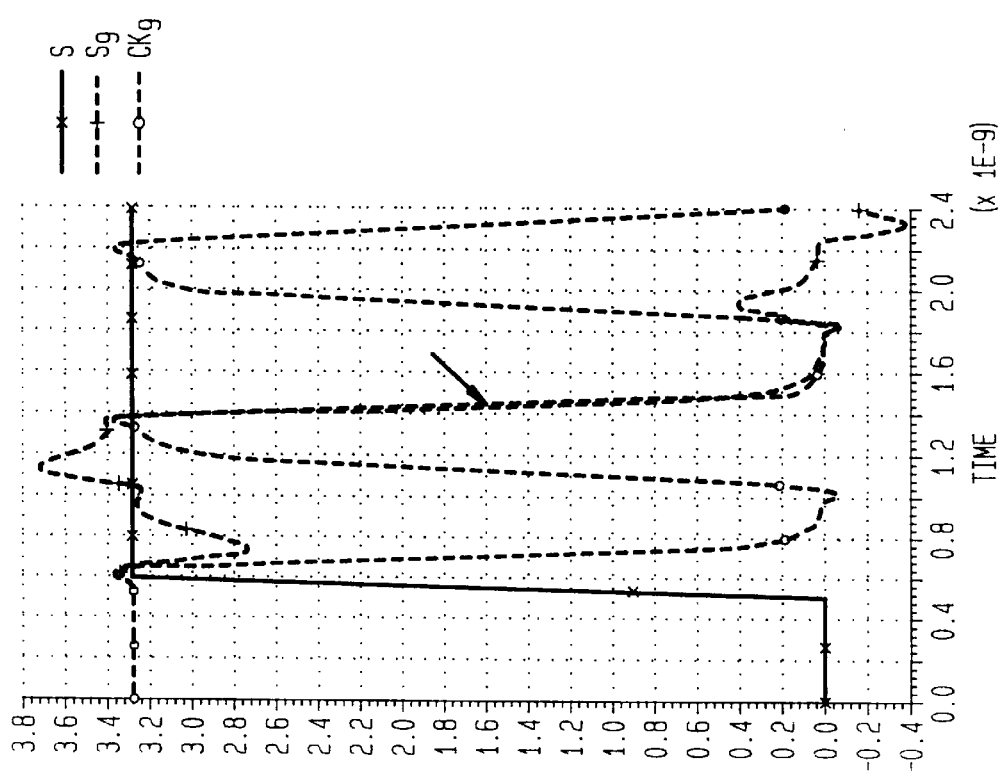
Figure 9B:
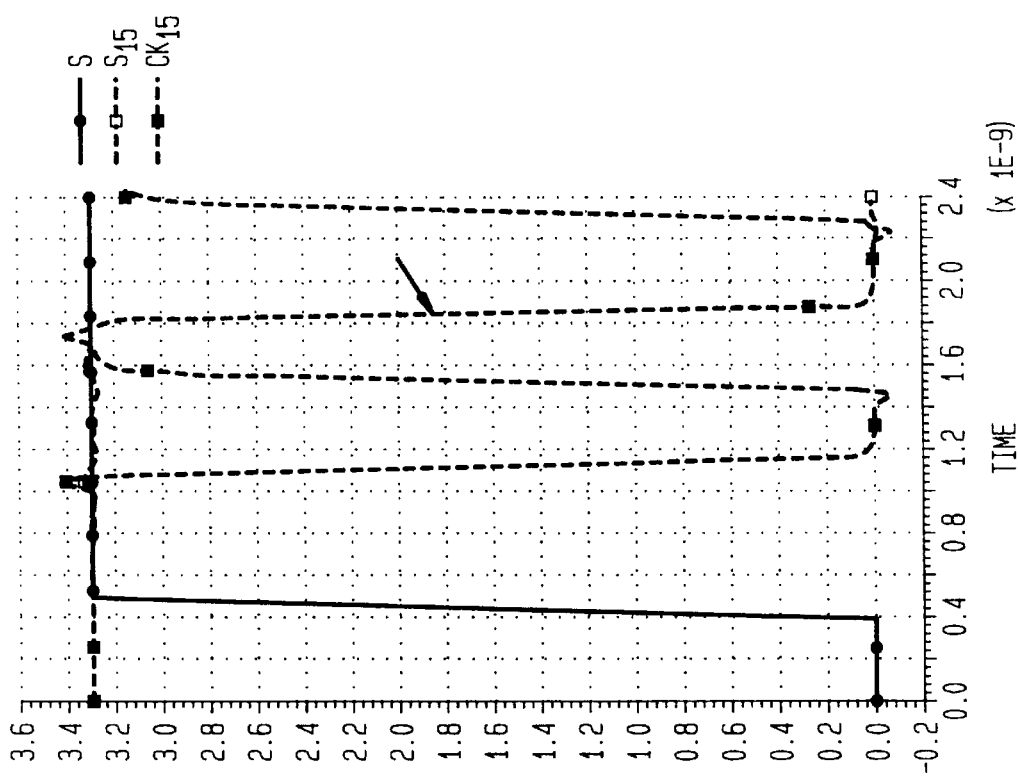
Figure 9A:
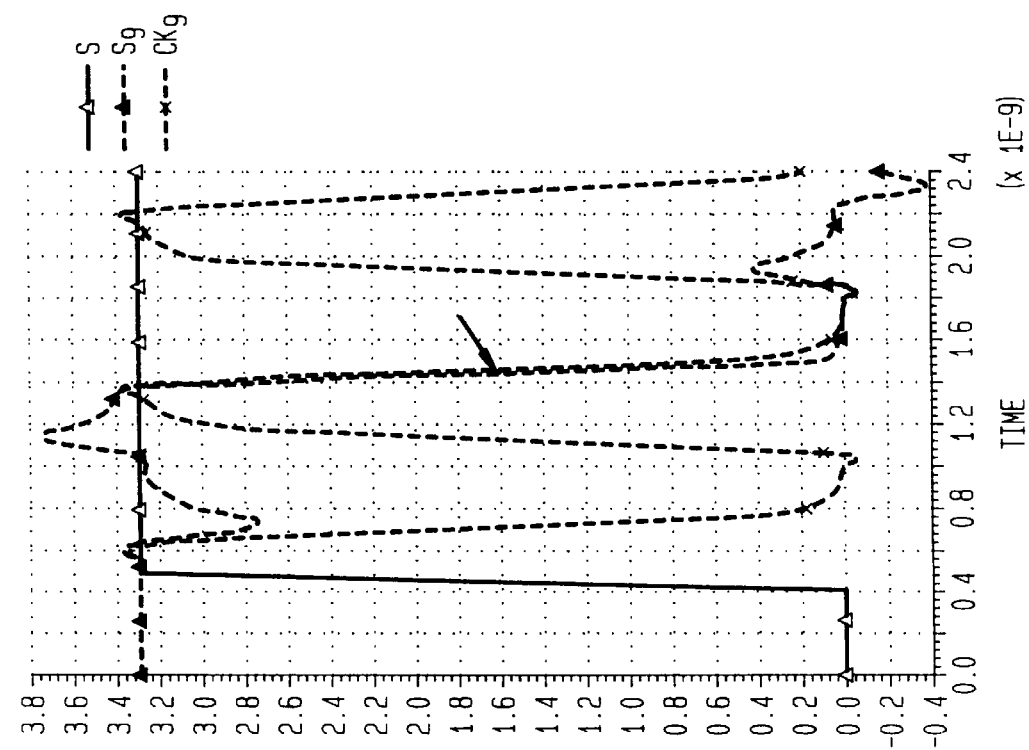

FIGS. 4A and 4B show simulation results of an exemplary implementation of the FIG. 1 transition edge alignment circuit. The inverters 12-i of inverter chain 12 each included an N-type field effect transistor having a 0.36 micron gate length and a 1.04 micron gate width and a P-type field effect transistor having a 0.40 micron gate length and a 2.16 micron gate width. The inverters 14-i of inverter chain 14 each included a parallel combination of four inverters having the gate lengths and widths of the inverters 12-i. The chain 14 inverters 14-i thus each had an effective transistor channel length four times greater and a capacitance load drive capability four times stronger than that of the corresponding inverters of chain 12. The coupling capacitance C between the outputs of each of the inverters 12-i and 14-i was selected as 10 femtofarads. The input signal CK was assumed to have a clock period of 0.8 nanoseconds or a frequency of 1.25 GHz. The power supply voltage was assumed to be a typical 3.3 volt supply, and the simulation was carried out at 85° C.

FIG. 4A shows the input signals S and CK applied to the edge alignment circuit of FIG. 1, and corresponding output signals $S_9$ and $CK_9$ after propagation through nine interacting inverter stages in the inverter chains 12 and 14. An odd number N of inverter stages was used to avoid clutter in the signal waveform plots. It can be seen from FIG. 4A that the LOW to HIGH transition of input signal S is delayed by about 100 picoseconds relative to the LOW to HIGH transition of input signal CK. After nine stages of interacting propagation in the edge alignment circuit of FIG. 1, the relative delay is reduced to about 15 picoseconds, as shown by the two almost synchronous HIGH to LOW transitions of $S_9$ and $CK_9$ at about t=0.7 nanoseconds. The waveform of signal $S_9$ in FIG. 4A exhibits a characteristic peak (P) and dip (D) at the HIGH to LOW transition edge of the clock signal $CK_9$, as described in conjunction with FIG. 3 above. The peak and dip appear at about t=1.15 nanoseconds and t=1.45 nanoseconds, respectively. However, the peak and dip do not have sufficient magnitude to create logic problems within the inverter chain 12 or subsequent circuitry. The presence of the peak and dip suggests that the edge alignment capability of the FIG. 1 circuit is attributable to nonlinear effects.

FIG. 4B shows the input signals S and CK and corresponding output signals $S_{15}$ and $CK_{15}$ after propagation through fifteen interacting inverter stages in the inverter chains 12 and 14. After fifteen stages of interacting propagation, the relative delay is reduced to almost zero, such that the input signals S and CK are almost completely synchronized. This synchronization can be seen in the corresponding HIGH to LOW transitions of signals $S_{15}$ and $CK_{15}$ at about t=1.1 nanosecond in FIG. 4B. FIGS. 4A and 4B indicate that an input signal S having a transition edge delayed by about 100 picoseconds from a corresponding transition edge of a 1.25 GHz clock signal CK can be almost completely synchronized with the signal CK in an embodiment of the FIG. 1 circuit in which the number of inverter stages N is selected as 15.

FIGS. 5A and 5B illustrate the operation of the FIG. 1 circuit under a simulation condition in which both the S and CK inputs are tied together and driven by a LOW to HIGH step function which will be designated CK. FIG. 5A shows the input signal CK and the outputs $S_9$ and $CK_9$ of the first and second inverter chains 12, 14 after nine stages of interacting propagation in which the coupling capacitance C is selected as 0.1 femtofarads. With this very small capacitive coupling value, the propagation velocity of the step function signal CK through the first inverter chain 12 is slightly less than that through the second inverter chain 14, due to the above-noted size differences between the inverters making up the chains. This propagation velocity difference would be about 20% if the coupling capacitors C were assumed to have a zero value. The propagation velocity difference can be seen in FIG. 5A in the relative positions of the HIGH to LOW transitions in the $S_9$ and $CK_9$ signals between t=0.6 and t=0.8 nanoseconds. In FIG. 5B, the value of the coupling capacitors C is increased to about 20 femtofarads, with all other circuit and signal parameters remaining the same as in the case of FIG. 5A. The presence of the larger coupling capacitors C tends to equalize the propagation velocity in the two inverter chains 12, 14 such that the relative delay between the LOW to HIGH transitions of the $S_9$ and $CK_9$ signals is substantially reduced.

FIGS. 6A and 6B, 7A and 7B, 8A and 8B, 9A and 9B and 10A and 10B show simulation results of an exemplary implementation of the FIG. 1 transition edge alignment circuit for initial relative delay values of 0.7 ns, 0.6 ns, 0.5 ns, 0.4 ns and 0.3 ns, respectively, between a transition edge of the input S signal and a corresponding transition edge of the input CK signal. FIGS. 6A, 7A, 8A, 9A and 10A show the input signal S and the output signals $S_9$ and $CK_9$ for an embodiment of the FIG. 1 circuit in which the number of stages N is nine. FIGS. 6B, 7B, 8B, 9B and 10B show the input signal S and the output signals $S_{15}$ and $CK_{15}$ for an embodiment of the FIG. 1 circuit in which the number of stages N is fifteen. The arrow in each figure shows an aligned transition edge of the output signals $S_N$ and $CK_N$. In each plot, the input signal CK is a 1.25 GHz clock signal having a period of 0.8 nanoseconds, and the input signal S is a step function having a LOW to HIGH transition delayed relative to a corresponding LOW to HIGH transition of the clock signal CK. The amount of initial relative delay in a given plot is shown by the position of the LOW to HIGH transition of the input signal S along the horizontal time axis. It can be seen from FIGS. 8A, 9A and 10A that nine stages may not provide sufficient synchronization between the input signals S and CK for initial relative delay values of 0.5, 0.4 and 0.3 nanoseconds, respectively. However, FIGS. 6B, 7B, 8B, 9B and 10B indicate that after fifteen stages of interacting propagation, the S and CK signal transition edges designated by the arrows are completely aligned. The relative delay values of 0.7, 0.6, 0.5, 0.4 and 0.3 nanoseconds represent a full range of clock signal phase for a 1.25 GHz clock signal in which the clock period is 0.8 nanoseconds, and the plots of FIGS. 6B through 10B indicate that edge alignment over this full range of phase is provided using interacting inverter chains having fifteen stages.

Figure 11:
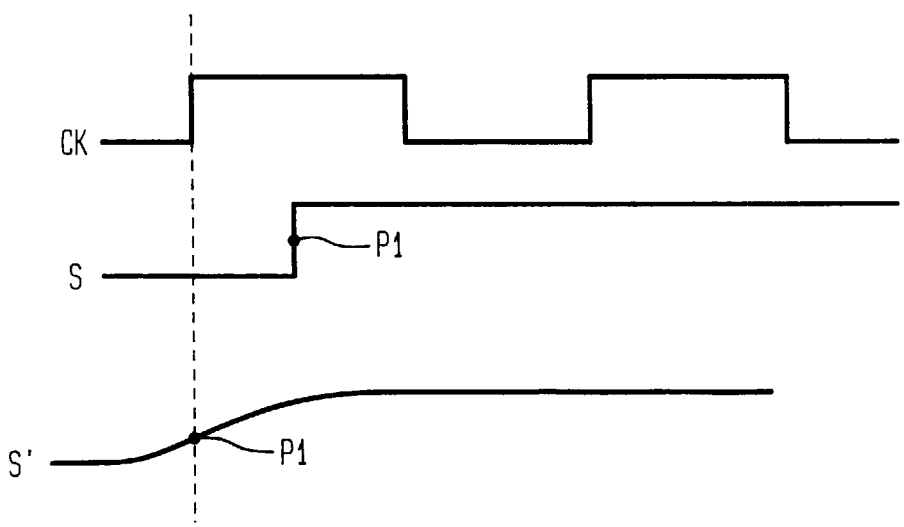
FIG. 11 shows exemplary first and second digital signals with initial transition rates and a relative delay between transition edges, and a delayed version of one of the signals generated in an exemplary embodiment of the invention.

FIG. 11 shows exemplary digital signals S and CK having transition edges with an initial relative delay of approximately one-fourth of the CK period. The signal S is in the form of a step function in this example. As described above, the transition edges of the S and CK signals can be aligned despite this initial relative delay by using an edge alignment circuit such as that shown in FIG. 1 and using interacting inverter chains having N inverters, where N may be on the order of fifteen. The number of inverters required may be decreased in accordance with the invention by reducing the transition rate of signal S to be synchronized with the clock signal CK. For example, the signal S may be subjected to additional capacitive loading at the input of a transition edge alignment circuit in accordance with the invention in order to produce the reduced transition rate signal S' shown in FIG. 11. The sharp transition edge of the signal S has been intentionally degraded by the additional input capacitive loading to reduce the initial relative delay between the mid-transition point P1 and the initial transition edge of the clock signal CK. This intentional reduction in the transition rate of signal S facilitates the subsequent transition edge alignment process and allows that process to be implemented using inverter chains with fewer inverters.

Figure 12:
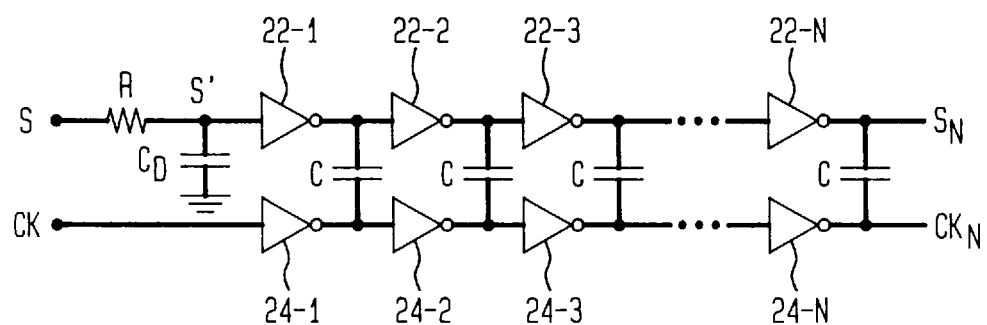
FIG. 12 shows an alternative embodiment of a transition edge alignment circuit of the present invention incorporating the transition edge delay feature illustrated in FIG. 11.

FIG. 12 shows an exemplary transition edge alignment circuit 20 in accordance with the present invention, incorporating the transition rate reduction feature illustrated in FIG. 11. A transition rate reduction for the signal S is provided in the circuit 20 by an RC delay circuit including a resistor R and a delay capacitor $C_D$. The values selected for R and $C_D$ in a given embodiment will depend on factors such as signal frequencies and the initial relative delay of the transition edges to be aligned. The output S' of the RC delay circuit is applied as an input to a first inverter chain including N series-connected inverters 22-i, i=1,2, . . . N. The other input signal CK is applied to a second inverter chain including N series-connected inverters 24-i. The inverters 24-i of the second inverter chain are larger and thus have a stronger drive capability than the inverters 22-i of the first inverter chain, as in the embodiment described above in conjunction with circuit 10 of FIG. 1. The circuit 20 includes N coupling capacitors C for providing interaction between the first and second inverter chains such that transition edges of the output signals $S_N$ and $CK_N$ are aligned in the manner previously described. The edge alignment circuit 20 of FIG. 12 can provide transition edge alignment using fewer inverter stages than the circuit 10 of FIG. 1 due to the additional delay provided by the RC delay circuit.

Figure 13:
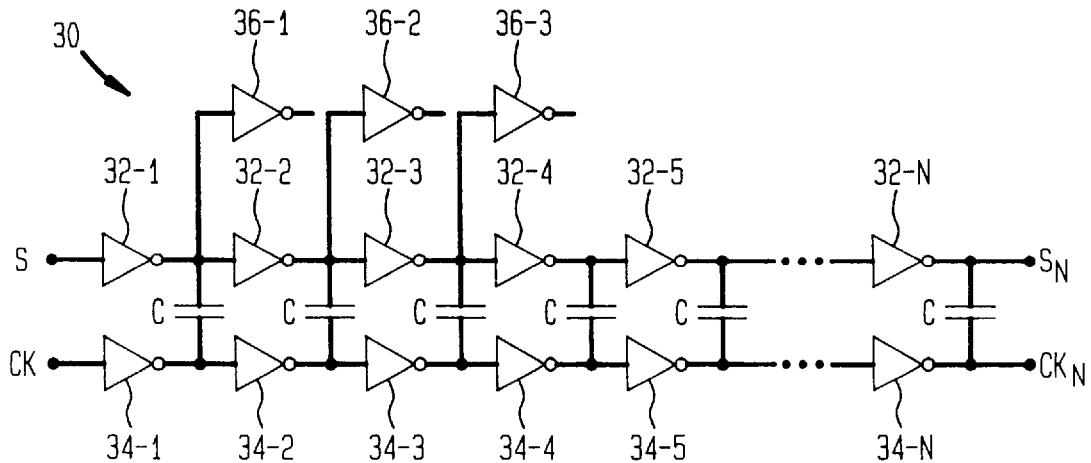
FIG. 13 shows another alternative embodiment of a transition edge alignment circuit of the present invention incorporating the transition edge delay feature illustrated in FIG. 11.

FIG. 13 shows another exemplary transition edge alignment circuit 30 incorporating the transition rate reduction feature illustrated in FIG. 11. The circuit 30 includes a first inverter chain with N series-connected inverters 32-i, i=1,2, . . . N and a second inverter chain with N series connected inverters 34-i. The inverters of the second inverter chain are larger and thus have a stronger drive capability than those of the first inverter chain, as described above in conjunction with circuit 10 of FIG. 1. The signal S is applied to an input of the first inverter chain, while the signal CK is applied to an input of the second inverter chain. The circuit 30 includes N coupling capacitors C for providing interaction between the first and second inverter chains such that transition edges of the output signals $S_N$ and $CK_N$ are aligned in the manner previously described. The transition rate reduction for the signal S is implemented in the circuit 30 by providing additional capacitive loading for a subset of the inverters 32-i of the first inverter chain, in order to intentionally degrade the transition edge of the input signal S in a manner similar to that described in conjunction with FIG. 11 above. The circuit 30 provides this additional capacitive loading by connecting an input of an additional inverter 36-2, 36-2 and 36-3 to the corresponding outputs of the first three inverters 32-1, 32-2 and 32-3, respectively, of the first inverter chain. The inverters 36-i serve to reduce the transition rate of the signal S along the first inverter chain via the Miller effect, such that transition edges of S and CK are aligned more quickly than would otherwise be possible. The edge alignment circuit 30 of FIG. 13 can therefore provide transition edge alignment using fewer inverter stages than the circuit 10 of FIG. 1. The number of first chain inverters 32-i which are loaded by an additional inverter 36-i in a particular application will generally depend on factors such as the signal frequencies, relative transition edge delay and the amount of capacitive loading provided by each inverter 36-i. However, it will generally be preferable to provide additional capacitive loading for only the first several inverters of a given inverter chain.

The above-described embodiments of the invention are intended to be illustrative only. For example, although the coupling capacitors C in a given one of the above-described embodiments may all have the same value, this is not a requirement of the invention. Different capacitive coupling values may be selected for different stages of the interacting chains, and the capacitive coupling may be provided using parasitic elements as well as discrete elements. In addition, the coupling capacitors need not be provided for all inverter stages of the interacting inverter chains. The additional capacitive loading to provide intentional reduction of a given signal transition rate may be implemented with an RC or other type of delay circuit, additional inverters or other circuits having inputs coupled to outputs of various inverters of one of the inverter chains, additional parasitic or discrete capacitive components coupled to particular points in the inverter chains, or by any other suitable technique. The relative effective channel widths, channel lengths and/or drive capabilities of the inverters of the first and second chain may very depending upon the needs of a particular application. Moreover, the invention may be used to synchronize transition edges of more than two signals by including an inverter chain for each signal along with appropriate capacitive coupling between the various chains. For example, two signals may be synchronized with a clock by providing three inverter chains, one for the clock and one for each of the signals, with the above-described capacitive coupling between each of the signal chains and the clock chain. Numerous other alternative embodiments may be devised by those skilled in the art without departing from the scope of the following claims.

What is claimed is:

1. A transition edge alignment circuit comprising:
    a first inverter chain including a first plurality of series-connected inverters and an input for receiving a first signal having a first transition edge;
    a second inverter chain including a second plurality of series-connected inverters and an input for receiving a second signal having a second transition edge, wherein at least a subset of the inverters in the second inverter chain have a substantially stronger drive capability than at least a subset of the inverters in the first inverter chain; and
    capacitive coupling between outputs of at least a subset of the first plurality of series-connected inverters and corresponding outputs of at least a subset of the second plurality of series-connected inverters, wherein interaction between the first and second inverter chains acts to align the first and second transition edges as the first and second signals propagate through the respective first and second inverter chains.

2. The circuit of claim 1 wherein the first signal applied to the input of the first inverter chain is a logic signal which triggers a particular operation in another circuit.

3. The circuit of claim 1 wherein the second signal applied to the input of the second inverter chain is a clock signal.

4. The circuit of claim 1 wherein the plurality of inverters of the second inverter chain each have a substantially stronger drive capability than the corresponding inverters of the first inverter chain.

5. The circuit of claim 1 wherein the inverters of the second inverter chain are approximately a constant k times larger in effective channel width than the corresponding inverters of the first inverter chain.

6. The circuit of claim 1 wherein the capacitive coupling includes a plurality of capacitors, with each capacitor connected between an output of an inverter of the first inverter chain and an output of a corresponding inverter of the second inverter chain.

7. The circuit of claim 6 wherein at least a subset of the plurality of capacitors have capacitance values greater than about 10 femtofarads.

8. The circuit of claim 1 wherein the first and second inverter chains each include the same number of inverters.

9. The circuit of claim 1 further including a transition rate reduction circuit having an input connected to receive the first signal and an output connected to the input of the first inverter chain.

10. The circuit of claim 9 wherein the transition rate reduction circuit includes a resistor connected between the reduction circuit input and the reduction circuit output, and a capacitor connected between the reduction circuit output and a circuit potential.

11. The circuit of claim 1 wherein at least a subset of the inverters of at least one of the first and the second inverter chains each has an output connected to a load in order to reduce a transition rate of at least one of the first and the second signal.

12. The circuit of claim 11 wherein the load for a given one of the inverters in the subset includes an additional inverter having an input coupled to an output of the given inverter.

13. A method of aligning signal transition edges comprising the steps of:
    applying a first signal having a first transition edge to an input of a first inverter chain including a first plurality of series-connected inverters;
    applying a second signal having a second transition edge to an input of a second inverter chain including a second plurality of series-connected inverters, wherein at least a subset of the inverters in the second inverter chain have a substantially stronger drive capability than at least a subset of the inverters in the first inverter chain; and
    capacitively coupling outputs of at least a subset of the first plurality of series-connected inverters and corresponding outputs of at least a subset of the second plurality of series-connected inverters, wherein interaction between the first and second inverter chains acts to align the first and second transition edges as the first and second signals propagate through the respective first and second inverter chains.

14. The method of claim 13 wherein the first signal applied to the input of the first inverter chain is a logic signal which triggers a particular operation in another circuit.

15. The method of claim 13 wherein the second signal applied to the input of the second inverter chain is a clock signal.

16. The method of claim 13 wherein field effect transistors of the inverters of the second inverter chain are approximately a constant k times larger in effective channel width than field effect transistors of the corresponding inverters of the first inverter chain.

17. The method of claim 13 wherein the step of capacitively coupling outputs of the first and second pluralities of series-connected inverters further includes the step of providing a plurality of capacitors, with each capacitor connected between an output of an inverter of the first inverter chain and an output of a corresponding inverter of the second inverter chain.

18. The method of claim 17 wherein the step of providing a plurality of capacitors further includes providing a plurality of capacitors at least a subset of which have capacitance values greater than about 10 femtofarads.

19. The method of claim 13 wherein the first and second inverter chains each include the same number of inverters.

20. The method of claim 13 further including the step of reducing a transition rate of one of the first signal and the second signal prior to applying that signal to the corresponding inverter chain.

21. The method of claim 20 wherein the step of reducing a transition rate of one of the first signal and the second signal further includes the step of applying one of the first signal and the second signal to an RC circuit.

22. The method of claim 13 further including the step of connecting an output of each of at least a subset of the inverters of at least one of the first and second inverter chains to a load to reduce the transition rate of at least one of the first and the second signal.

23. The method of claim 22 wherein the step of connecting an output of each of at least a subset of the inverters of at least one of the first and the second inverter chains to a load further includes the step of connecting an output of a given inverter in the subset to an input of at least one additional inverter.

24. An integrated circuit comprising:
    a transition edge alignment circuit including a first inverter chain having an input for receiving a first signal having a first transition edge, and a second inverter chain having an input for receiving a second signal having a second transition edge, wherein at least a subset of the inverters in the second inverter chain have a substantially stronger drive capability than at least a subset of the inverters in the first inverter chain, and wherein inverter outputs of the first inverter chain are capacitively coupled to corresponding inverter outputs of the second inverter chain such that interaction between the first and second inverter chains acts to align the first and second transition edges as the first and second signals propagate through the respective first and second inverter chains; and a subsequent circuit having inputs for receiving at least one of the first and second signals from a corresponding output of the transition edge alignment circuit.

25. The integrated circuit of claim 24 wherein the plurality of inverters of the second inverter chain each have a substantially stronger drive capability than the corresponding inverters of the first inverter chain.

26. The integrated circuit of claim 24 wherein the second inverter chain includes inverters having a larger effective channel width than corresponding inverters of the first inverter chain.

27. The integrated circuit of claim 24 wherein the first signal is a logic signal and the second signal is a clock signal, and further wherein the subsequent circuit includes a latch for latching a logic level of the logic signal using the transition edge of the clock signal.

28. A transition edge alignment circuit comprising:

a first inverter chain including a first plurality of series-connected inverters and an input for receiving a first signal having a first transition edge;

a second inverter chain including a second plurality of series-connected inverters and an input for receiving a second signal having a second transition edge;

capacitive coupling between outputs of at least a subset of the first plurality of series-connected inverters and corresponding outputs of at least a subset of the second plurality of series-connected inverters; and a rate reduction device for reducing a transition rate of at least one of the first signal and the second signal prior to application of that signal to the corresponding inverter chain.

29. A transition edge alignment circuit comprising:

a first inverter chain including a first plurality of series-connected inverters and an input for receiving a first signal having a first transition edge;

a second inverter chain including a second plurality of series-connected inverters and an input for receiving a second signal having a second transition edge; and capacitive coupling between outputs of at least a subset of the first plurality of series-connected inverters and corresponding outputs of at least a subset of the second plurality of series-connected inverters, wherein at least a subset of the inverters of at least one of the first and the second inverter chains has an output connected to a load in order to reduce a transition rate of at least one of the first signal and the second signal.

30. A method of aligning signal transition edges comprising the steps of:

applying a first signal having a first transition edge to a first inverter chain including a first plurality of series-connected inverters;

applying a second signal having a second transition edge to a second inverter chain including a second plurality of series-connected inverters;

capacitively coupling outputs of at least a subset of the first plurality of series-connected inverters and corresponding outputs of at least a subset of the second plurality of series-connected inverters; and reducing a transition rate of at least one of the first signal and the second signal prior to applying that signal to the corresponding inverter chain.

31. A method of aligning signal transition edges comprising the steps of:

applying a first signal having a first transition edge to a first inverter chain including a first plurality of series-connected inverters;

applying a second signal having a second transition edge to a second inverter chain including a second plurality of series-connected inverters;

capacitively coupling outputs of at least a subset of the first plurality of series-connected inverters and corresponding outputs of at least of the second plurality of series-connected inverters; and connecting an output of each of at least a subset of the inverters of at least one of the first and second inverter chains to a load in order to reduce the transition rate of at least one of the first signal and the second signal.

32. A transition edge alignment circuit comprising:

a first inverter chain including a plurality of inverters connected in series and an input for receiving a first signal having a first transition edge;

a second inverter chain including a plurality of inverters connected in series and an input for receiving a second signal having a second transition edge, wherein at least a subset of the inverters in the second inverter chain have a substantially larger effective channel width than at least a subset of the inverters in the first inverter chain; and capacitive coupling between outputs of at least a subset of the inverters of the first inverter chain and corresponding outputs of at least a subset of the inverters of the second inverter chain, such that interaction between the first and second inverter chains acts to align the first and second transition edges as the first and second signals propagate through the respective first and second inverter chains.

33. A method of aligning signal transition edges comprising the steps of:

applying a first signal having a first transition edge to a first inverter chain including a plurality of inverters connected in series;

applying a second signal having a second transition edge to an input of a second inverter chain including a plurality of inverters connected in series, wherein at least a subset of the inverters in the second inverter chain have a substantially larger effective channel width than at least a subset of the inverters in the first inverter chain; and capacitively coupling outputs of at least a subset of the first inverter chain and corresponding outputs of at least a subset of the inverters of the second inverter chain, wherein interaction between the first and second inverter chains acts to align the first and second transition edges as the first and second signals propagate through the respective first and second inverter chains.

* * * * *